(12) United States Patent
Bondurant (10) Patent No.: US 6,373,751 B1
(45) Date of Patent: Apr. 16, 2002

(54) PACKET-BASED INTEGRATED CIRCUIT DYNAMIC RANDOM ACCESS MEMORY DEVICE INCORPORATING AN ON-CHIP ROW REGISTER CACHE TO REDUCE DATA ACCESS LATENCIES

(75) Inventor: David Bondurant, Colorado Springs, CO (US)

(73) Assignee: Enhanced Memory Systems, Inc., Colorado Springs, CO (US)

( * ) Notice: Subject to any disclaimer, the term of this patent is extended or adjusted under 35 U.S.C. 154(b) by 0 days.

(21) Appl. No.: 09/571,135

(22) Filed: May 15, 2000

(51) Int. Cl.$^7$ .............................................. G11C 16/04

(52) U.S. Cl. ............................ 365/189.05; 365/189.01; 365/189.02

(58) Field of Search ........................... 365/189.05, 203, 365/222, 189.01, 189.02, 30.03

(56) References Cited

U.S. PATENT DOCUMENTS 6,151,236 A * 11/2000 Bondurant et al. ......... 365/203
6,181,612 B1 * 1/2001 Wada .................... 365/189.12
6,262,937 B1 * 7/2001 Arcolo et al. .......... 365/189.05

OTHER PUBLICATIONS

"Rambus® Technology Overview; The Rambus Solution: The Rambus Channel, the RDRAM® and the Memory Controller" © Copyright Aug. 1999, Rambus Inc., Last Modified: Aug. 23, 1999, pp. 1–10.

Direct RDRAM$^{SM}$ 64/72–Mbit (256Kx16/18x16d), © Copyright Aug. 1998 Rambus Inc., pp. 1–62.

McCOMAS, "DDR vs. Rambus; A Hands–on Performance Comparison", InQuest Market Research, Nov. 1999, page 1–7.

* cited by examiner

Primary Examiner—Amir Zarabian
Assistant Examiner—VanThu Nguyen
(74) Attorney, Agent, or Firm—William J. Kubida, Esq.; Hogan & Hartson, LLP (57) ABSTRACT

A packet-based dynamic random access memory ("DRAM") device incorporating an on-chip row register cache which is functional to reduce the initial device latency, reduce "page miss" latency and reduce chip layout overhead by reducing bus sizes and the level of required multiplexing and demultiplexing compared to Rambus® Direct RDRAM™ (trademarks, of Rambus, Inc., Mountain View, Calif.) devices. In accordance with an embodiment of the present invention, the row register cache and a separate write path, or bus, are integrated into each DRAM bank serving to improve DRAM latency parameters and pipeline burst rate, The row register holds "read" data during burst reads to allow hidden precharge and same bank activation to minimize "page miss" latency. The faster pipelined burst rate simplifies Direct RDRAM multiplexer/demultiplexer logic and reduces internal data bus size by 50%.

8 Claims, 4 Drawing Sheets

Fig. 3A
Direct RDRAM Page Miss
(Read-Read)

Fig. 3B
Enhanced RDRAM Page Miss
(Read-Read)

Fig. 4A
Direct RDRAM Page Miss
(Read-Write)

Fig. 4B
Enhanced RDRAM Page Miss
(Read-Write)

PACKET-BASED INTEGRATED CIRCUIT DYNAMIC RANDOM ACCESS MEMORY DEVICE INCORPORATING AN ON-CHIP ROW REGISTER CACHE TO REDUCE DATA ACCESS LATENCIES

BACKGROUND OF THE INVENTION

The present invention relates, in general, to the field of integrated circuit ("IC") dynamic random access memory ("DRAM") devices. More particularly, the present invention relates to a packet-based DRAM memory device incorporating an on-chip row register cache which is functional to reduce overall data access latencies, especially with respect to "page misses".

A new type of volatile random access memory devices has been recently introduced which uses low pin count interfaces operating at high clock rates to multiplex memory control, address, and data in and out of the chip. These so called "protocol-based" or "packet-based" memories have the benefit of delivering high potential bandwidth in a low-pin count single chip IC package. This approach is particularly interesting for small systems containing just a single processor component and a single memory device.

The Rambus® DRAM ("RDRAM™" trademarks of Rambus, Inc., Mountain View, Calif.) was the first of several proposed packet-based DRAM devices. The most current version of this product was developed in conjunction with Intel Corporation, Santa Clara, Calif. and is called the Direct Rambus DRAM (or "DRDRAM"). See for example, Rambus® Technology Overview, Rambus, Inc., Aug. 23, 1999 and Direct RDRAM™ Advance Information 64/72-Mbit (256K×16/18×16d) Rambus, Inc. Aug. 3, 1998, the disclosures of which are specifically incorporated herein by this reference. The Direct RDRAM has been optimized to allow concurrent command, address, and data packets to be transferred to improve the efficiency of the bus interface.

Nevertheless, the DRDRAM presents several operational limitations which prevent its optimum performance and cost effectiveness. Firstly, the DRDRAM architecture imposes significantly larger chip sizes than are found in traditional DRAM components. This size increase results from the need to multiplex and demultipex data and addresses at the bus interface. Specifically, the current DRDRAM embodiment has a relatively complex eight way multiplexer and demultiplexer interface to the external data bus. This level of multiplexing is determined by the external data bus size and pipelined data speed of the core DRAM memory banks. The 18 bit external data bus is specified at an 800 MHz data rate and the DRAM core must deliver a 1.6 GB/sec. bandwidth. Current DRAM cores can deliver a new data-word every 10 ns or a 100 MHz data rate. For this core, the internal DRAM bus must be eight times 18 bits (or 144 bits) to deliver the specified data rate.

Secondly, multiplexing address and data buses increases random access latency compared to synchronous DRAM ("SDRAM"). At 800 MHz, address packet delays are 10 ns and data packet delays for a 64 bit equivalent word are 5 ns. Consequently, every SDRAM random access parameter is degraded by 15 ns in Direct RDRAM.

Thirdly, standard DRAM core exhibits relatively long latency on same bank "page misses" which reduce bus efficiency. The standard DRAM core uses page mode operation, which means that data is held in the DRAM sense amplifiers during random access within a page. If a request for another page in the same bank occurs, the DRAM must precharge and then another row must be randomly accessed into the sense amps. This "page miss" can take on the order of 70 ns in current DRAM technology. A "page miss" greatly reduces bus efficiency and delivered bandwidth. The maximum bandwidth for the device is equal to four data words (64 bit) at 5 ns/data word, which is 20 ns for 32 bytes, or 1600 MB/sec. On the other hand, the worst case bandwidth (in the case of a "page miss", Read-to-Read) is 77.5 ns ("page miss") plus three data word (64-bit) times at 5 ns/data word which equals 92.5 ns for 32 bytes or 338 MB/sec. Thus, it can be seen that Direct RDRAM bus efficiency is reduced from 100% to 21% under continuous random "page misses" while delivered bandwidth is reduced from 1600 MB/Sec to 338 MB/Sec.

SUMMARY OF THE INVENTION

Enhanced Memory Systems, Inc., a subsidiary of Ramtron International Corporation, Colorado Springs, Colo. and assignee of the present invention, has long been a pioneer in defining low latency, high efficiency DRAM core architectures based on its proprietary EDRAM® core technology (EDRAM® is a registered trademark of Enhanced Memory Systems, Inc., Colorado Springs, Colo.). See for example, U.S. Pat. Nos. 5,699,317, 5,721,862, and 5,887,272, the disclosures of which are specifically incorporated herein by this reference, and which disclose certain implementations of the application of this technology to standard DRAM architectures.

Disclosed herein are extensions of this EDRAM technology implemented to enhance packet-based DRAM architectures, such as Direct RDRAM, to reduce the initial device latency, reduce "page miss" latency and reduce chip layout overhead by reducing bus sizes and the level of required multiplexing and demultiplexing.

In accordance with an embodiment of the present invention disclosed herein, a row register (or "cache") and separate write path, or bus, are integrated into each DRAM bank. This enhanced DRAM architecture, improves DRAM latency parameters and pipeline burst rate. The row register holds "read" data during burst reads to allow hidden precharge and same bank activation to minimize "page miss" latency. The faster pipelined burst rate simplifies Rambus RDRAM multiplexer/demultiplexer logic and reduces internal data bus size by 50%.

Particularly disclosed herein is a packet-based integrated circuit device comprising at least one dynamic random access memory bank having associated row and column decoders for specifying memory locations therein in response to externally supplied row and column addresses. The device includes at least one sense amplifier circuit coupled to the column decoder for reading data from the memory bank, a row register coupled to the sense amplifier circuit for retaining at least a portion of the data read out from the memory bank, a multiplexer circuit coupling the row register to an external data bus for supplying the read out data thereon and a demultiplexer circuit coupling the external data bus to the sense amplifier circuit for supplying data applied to the external data bus to the memory bank.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
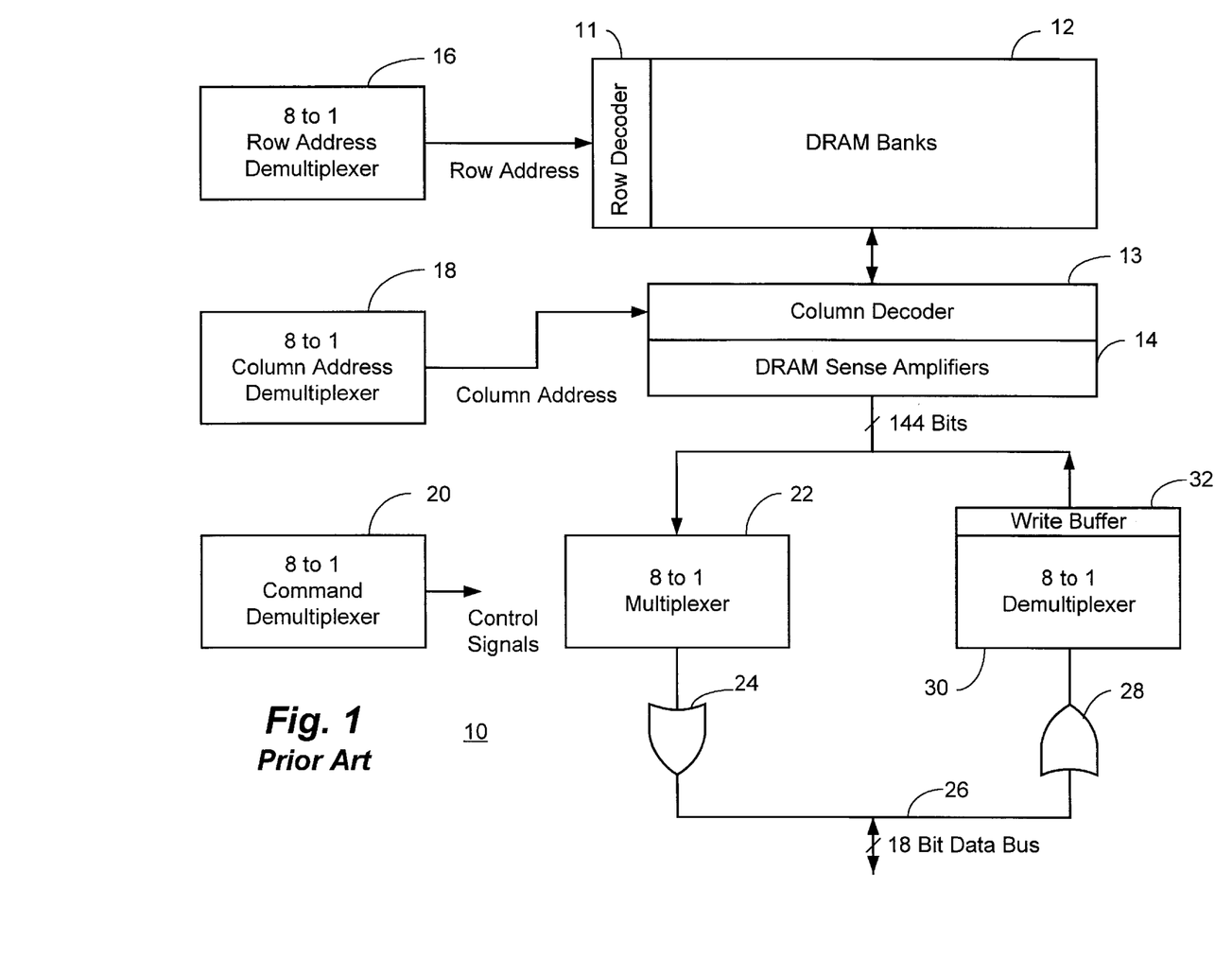
FIG. 1 illustrates a conventional Direct Rambus DRAM architecture illustrating the need for a 144 bit internal data bus and 8:1 multiplexing and de-multiplexing to a bi-directional 18 bit external data bus.

With reference now to FIG. 1, a conventional Direct Rambus DRAM device 10 architecture is shown. The Direct RDRAM device 10 comprises, in pertinent part, one or more DRAM banks 12 and associated row decoders 11 and column decoders 13. A number of DRAM sense amplifiers 14 couple the DRAM banks 12 through the column decoders 13 to an internal 144 bit data bus as shown.

Access to the memory locations in the DRAM banks 12 is had via an address bus coupled to 8 to 1 row address demultiplexers 16 and 18 for supplying row and column addresses to the row decoders 11 and column decoders respectively. Control signals for the Direct RDRAM device 10 are also supplied externally through an additional 8 to 1 command demultiplexer 20.

The 144 bit internal data bus provides data read from the DRAM banks 12 to an 8 to 1 multiplexer 22, the output of which is selected by gates 24 for output from the Direct RDRAM 10 on an 18 bit bi-directional data bus 26. Data to be written to the Direct RDRAM device 10 is supplied on the 18 bit data bus 26 and selected by gates 28 to an 8 to 1 demultiplexer 30 having an associated write buffer 32 for temporary retention of data to be ultimately written to the DRAM banks 12. The output of the write buffer 32 is supplied to the DRAM sense amplifiers 14 through the internal 144 bit data bus. As can be seen, the Direct RDRAM device 10 requires a relatively wide 144 bit internal data bus in addition to the provision of 8:1 multiplexing and demultiplexing to the bi-directional 18 bit external data bus 26.

Figure 2:
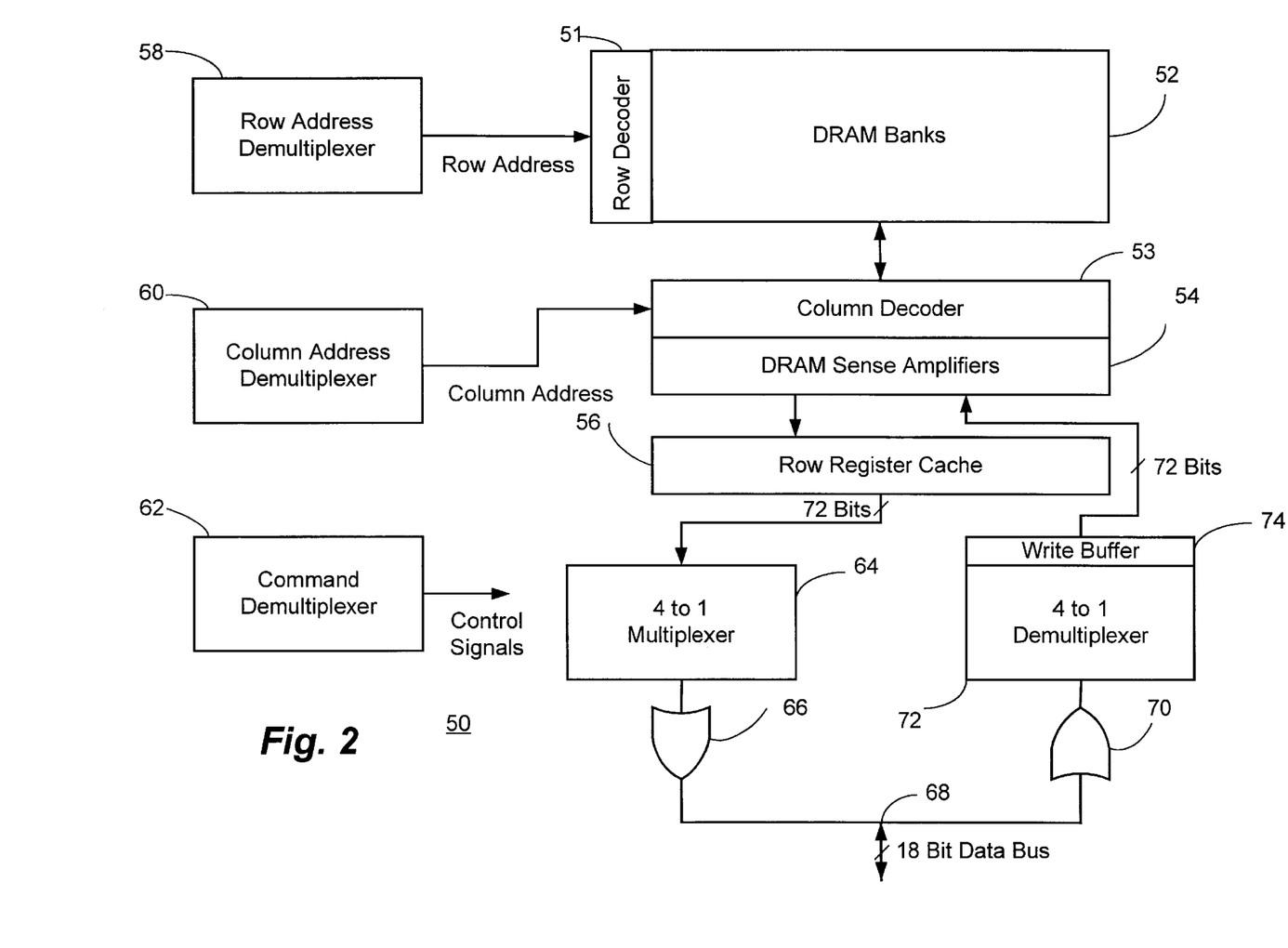
FIG. 2 illustrates a packet-based DRAM memory device in accordance with an embodiment of the present invention incorporating one or more on-chip registers (or "cache") which retains at least a portion of data read out from the DRAM banks and having a 72 bit internal data bus and 4:1 multiplexing and de-multiplexing to a bi-directional 18 bit external data bus.

With reference additionally now to FIG. 2; a packet-based DRAM memory device 50 in accordance with an embodiment of the present invention is shown. The memory device 50 includes DRAM banks 52, associated row decoders 51 and column decoders 53 together with DRAM sense amplifiers 54 as in the conventional Direct RDRAM device 10 shown in the preceding figure. However, the memory device 50 further incorporates one or more on-chip row registers (or "cache") 56 which retain at least a portion of data read out from the DRAM banks 52.

Access to the memory device 50 is afforded through respective row and column address demultiplexers coupled to an external address bus for supplying row and column addresses to the row decoders 51 and column decoders 53. Likewise, control signals for the memory device 50 are supplied through a command demultiplexer 62.

At least a portion of the data read out from the DRAM banks 52 is maintained in the row register cache 56 and is then supplied on a 72 bit internal read data bus to a 4 to 1 multiplexer 64. The output of the 4 to 1 multiplexer 64 is then selected by gates 66 for output on an external 18 bit data bus 68. Data to be written to the memory device 50 is supplied on the 18 bit data bus 68 and selected through gates 70 for input to a 4 to 1 demultiplexer 72 having an associated write buffer 74. Data to be written to the DRAM banks 52 is temporarily retained in the write buffer 74 for application to the DRAM sense amplifiers. 54 over a 72 bit internal write data bus. As can be seen, the memory device 50 includes a row register 56 for faster access to data in addition to a relatively smaller 72 bit internal data bus and simplified 4:1 multiplexing and de-multiplexing to the bi-directional 18 bit external data bus 68 while simultaneously presenting an external interface equivalent to that of the conventional Direct RDRAM device 10 of FIG. 1.

The memory device 50 appears externally identical to a conventional Direct RDRAM 10 (FIG. 1) but has a different DRAM core implementation using a set of row register caches 56 tightly integrated with the DRAM sense amplifiers 54 and a separate write path that allows writes to go directly to the sense amplifiers 54. The integrated row register cache 56 supports a faster 5 ns (or 200 MHz) pipelined burst rate that allows the internal data path to be reduced to 72 bits (from 144 bits in the conventional Direct RDRAM 10) and a simpler 4 to 1 multiplexer 64 and demultiplexer 72 at the data interface.

In addition to simplifying the data path, multiplex and demultiplexing logic and reducing the internal bus wiring by 50%, the enhanced DRAM core of the memory device 50 improves basic DRAM parameters as shown in the following Table 1:

TABLE 1

| Parameter | Conventional DRDRAM 10 | Memory Device 50 |
| --- | --- | --- |
| $t_{RC}$ | 70 ns | 35 ns |
| $t_{RAS}$ | 50 ns | 25 ns |
| $t_{RP}$ | 20 ns | 15 ns |
| $t_{RR}$ | 20 ns | 15 ns |
| $t_{RCD}$ | 22.5 ns | 15 ns |
| $t_{RAC}$ | 45 ns | 25 ns |
| $t_{CAC}$ | 20 ns | 10 ns |
| $t_{CWD}$ | 15 ns | 10 ns |
| $t_{Packet}$ | 10 ns | 10 ns |
| $t_{RTR}$ | 20 ns | 15 ns |
| $t_{OFFP}$ | 10 ns | 0 ns |

With respect to the foregoing Table 1, $t_{RC}$ is the row cycle time; $t_{RAS}$ is the row address strobe ("RAS")-asserted time; $t_{RP}$ is the row precharge time; $t_{RR}$ is the RAS-to-RAS time; $t_{RCD}$ is the RAS to column address strobe ("CAS") delay time; $t_{RAC}$ is the RAS access delay time; $t_{CAC}$ is, the CAS access delay time; $t_{CWD}$ is the CAS write delay time; $t_{Packet}$ is the length of the packet; $t_{RTR}$ is the interval from a column operation ("COLC") packet with a write precharge ("WR") command to COLC packet which causes retire; and $t_{OFFP}$ is the interval from COLC packet with a read precharge ("RDA") command.

These improvements in DRAM core speed reduce the impact of the Address/Command and data packet delays by at least 10 ns and 5 ns respectively.

Row Access Time $$= t_{Packet} + t_{RCD} + t_{CAC} + 0.5 * t_{Packet}$$

$$= 10 \text{ ns} + 22.5 \text{ ns} + 20 \text{ ns} + 5 \text{ ns} = 57.5 \text{ ns}$$

for the conventional Direct DRDRAM 10;

$$= 10 \text{ ns} + 15 \text{ ns} + 10 \text{ ns} + 5 \text{ ns} = 40 \text{ ns}$$

for the memory device 50.

Row Access Improvement $$= (57.5 \text{ ns} - 40 \text{ ns})/40 \text{ ns} = 44\%$$

due to the row register cache 56 and DRAM banks 52 core.

Column Access Time $$= t_{Packet} + t_{CAC} + 0.5 * t_{Packet}$$

$$= 10 \text{ ns} + 20 \text{ ns} + 5 \text{ ns} = 35 \text{ ns}$$

for the conventional Direct DRDRAM 10;

$$= 10 \text{ ns} + 10 \text{ ns} + 5 \text{ ns} = 25 \text{ ns}$$

for the memory device 50.

Column Access Time Improvement $$= (35 \text{ ns} - 25 \text{ ns})/25 \text{ ns} = 40\%$$

due to the row register cache 56 and DRAM banks 52 core.

The fast EDRAM Core of the memory device 50 also improves the latency of page misses following write cycles:

Page Miss (Write-to-Read)

$$= 0.5 * t_{Packet} + t_{RP} + t_{RCD} + t_{CAC} + 0.5 * t_{Packet}$$

$$= 5 \text{ ns} + 20 \text{ ns} + 22.5 \text{ ns} + 20 \text{ ns} + 5 \text{ ns} = 72.5 \text{ ns}$$

for the conventional Direct RDRAM 10;

$$= 5 \text{ ns} + 15 \text{ ns} + 15 \text{ ns} + 10 \text{ ns} + 5 \text{ ns} = 50 \text{ ns}$$

for the memory device 50.

Pass Miss (Write-to-Read) Improvement $$= (72.5 \text{ ns} - 50 \text{ ns})/50 \text{ ns} = 45\%$$

due to the row register cache 56 and DRAM banks 52 core.

Page Miss (Write-to-Write)

$$= 0.5 * t_{Packet} + t_{RP} + t_{RCD} + t_{CWD} + 0.5 * t_{Packet}$$

$$= 5 \text{ ns} + 20 \text{ ns} + 22.5 \text{ ns} + 15 \text{ ns} + 5 \text{ ns} = 67.5 \text{ ns}$$

for the conventional Direct RDRAM 10;

$$= 5 \text{ ns} + 15 \text{ ns} + 15 \text{ ns} + 10 \text{ ns} + 5 \text{ ns} = 50 \text{ ns}$$

for the memory device 50.

Page Miss (Write-to-Write) Improvement $$= (67.5 \text{ ns} - 50 \text{ ns})/50 \text{ ns} = 35\%$$

due to the row register cache 56 and DRAM banks 52 core.

In addition to faster DRAM core architecture, the memory device 50 architecture allows hidden precharge and a same Row activation feature that results from the row register cache 56 holding the read data during burst reads. This caching allows concurrent precharge and row activation functions not allowed by the Direct RDRAM device 10 core.

In the exemplary embodiment of the memory device 50 shown, the DRAM core may be constructed with any number of DRAM bank 12 array blocks. Each array block has associated sense amplifiers 54, a row register cache 56, and separate logic path to allow write operations to go to the sense amplifiers 54 and read operations to be from the row register cache 56, which may comprise static random access memory ("SRAM") or other high speed memory. The DRAM banks 52 and integrated row register cache 56 interface with a 72 bit internal data bus which is coupled to a data path multiplexer 64 and demultiplexer 72 logic at the chip interface. During read data transfers, the DRAM banks 52 with integrated row register cache 56 places 72 bits of data (4 data words) on the internal data bus every 5 ns. The multiplexer 64 logic sequentially selects one data word to the output data bus 68 every 1.25 ns. The conventional Rambus interface of the Direct RDRAM device 10 operates at a 400 MHz (2.5 ns clock cycle) rate and data is placed on the output data bus 26 (FIG. 1) on both the rising and falling edge of the clock.

During writes, data is input to the demultiplexer 72 logic of the memory device 50 every 1.25 ns (rising and falling edges of the clock). The write buffer 74 accumulates 4 data words every 5 ns. This write buffer 74 is double buffered so that 72 bit of write data is written to the selected DRAM bank 52 every 5 ns while additional write data is being input to the primary buffer stage.

Read Operations

A read operation is initiated by a row packet on the row input bus. The row address and command are multiplexed into the chip on the rising and falling clock edges at a 1.25 ns rate. A total of four clock cycles are necessary to input the row packet and command (10 ns). Once the row packet is input and the command decoded, the DRAM bank 52 is selected and the selected row address is read into the sense amplifiers 54 of that bank after the time $t_{RCD}$ (15 ns). In parallel with the row access, a column address and read command are multiplexed over the column address bus during four clock cycles. It is timed to arrive after $t_{RCD}$. Once the read command is executed, the sense amplifier 54 data is latched into the row register cache 56 for the selected bank and 72 bits of data is transferred to the output multiplexer 64 over the next four clock periods. At the end of this period, the row register cache 56 is latched and an additional 72 bit words are transferred to the multiplexer 64 every two clock cycles (5 ns). If the read command is issued with an auto precharge or if a manual precharge is placed on the row address bus during the packet time following the column read command, the DRAM bank 52 will enter precharge four clocks (1 packet delay, $t_{Packet}$) following the read command. The precharge time ($t_{RP}$) occurs while data is being transferred to the multiplexer 64 from the row register cache 56. The entire precharge delay is hidden during a two packet data transfer (32 byte transfer).

Once the precharge time is complete, it is possible to begin the next access to the same bank by another row address, bank activate command on the multiplexed row address bus. This information can be timed to initiate the command as soon as the $t_{RP}$ time is met for a 32 byte data transfer and one half of a packet (5 ns) of the row-to-column delay can be hidden to reduce "page miss" latency. For longer transfers, the entire row-to-column delay can be hidden. The combination of hidden precharge and hidden same bank activation reduces the "page miss" read-to-read latency from 77.5 ns in the conventional Direct RDRAM device 10 (FIG. 1) to 25 ns for the memory device 50 (FIG. 2).

Write Operations

A write operation is initiated by a row packet with bank activate command on the row bus. The information is clocked on four clock cycles, or 10 ns. At the end of the packet transfer, the command is decoded, the selected bank is activated and the row address is read to the sense amplifiers 54 in a time $t_{RCD}$. The column address packet with write command is transferred in parallel with $t_{RCD}$. As soon as it is received, the specified column address in the sense amplifiers 54 is selected and write data can begin being input to the demultiplexer 72. After a time $t_{CWD}$, data packets are input to the write buffer 74.

After every two clock cycles (5 ns), data is written over the 72 bit internal bus to the select sense amplifier 54 location, the column address is incremented and another 72 bit word is written each 5 ns period. As soon as the last packet is received, a precharge command may be issued (or precharge will automatically begin on write a auto-precharge command) a one half packet delay (5 ns) after the last data input. This restores data to the DRAM banks 52 and readies the DRAM for the next cycle.

Figure 3A:
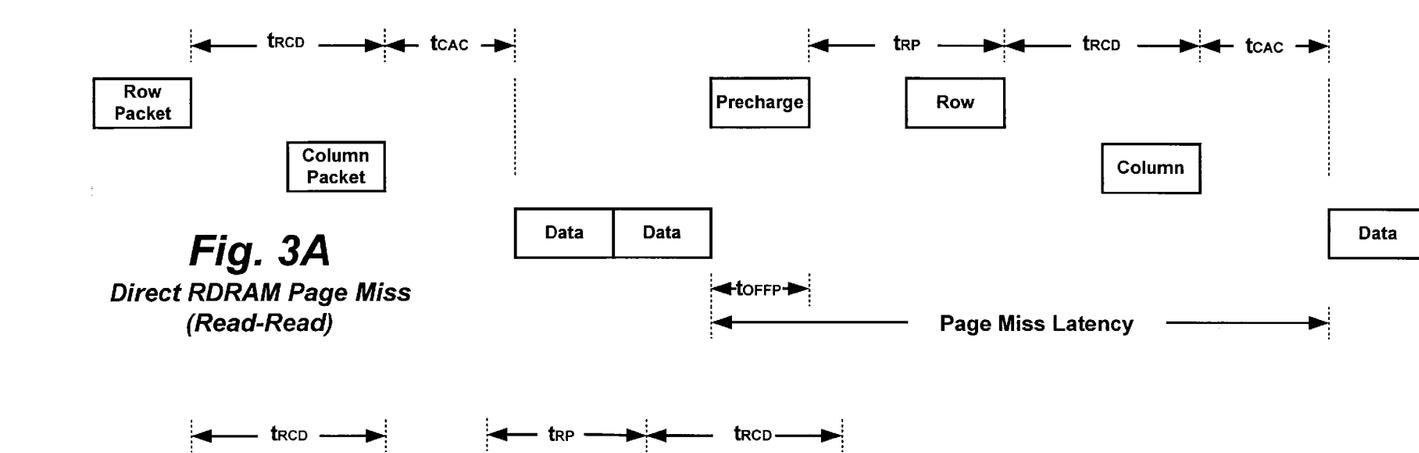
FIG. 3A is a simplified timing diagram of the row, column and data activity for a "page miss" occurring between two consecutive "read" transactions for the conventional Direct RDRAM of FIG. 1.

With reference additionally now to FIG. 3A, a simplified timing diagram of the row, column and data activity for a "page miss" occurring between two consecutive "read" transactions for the conventional Direct RDRAM device 10 of FIG. 1 is shown.

It should be noted that the Direct RDRAM device 10 keeps column data in the sense amplifiers 14 of the DRAM. The precharge command cannot initiate the precharge cycle on a "page miss" until time, $t_{OFFP}$, after the last data packet. The combination of late precharge and slow DRAM core parameters results in long "page miss" latency and poor bus efficiency for same bank "page misses".

Figure 3B:
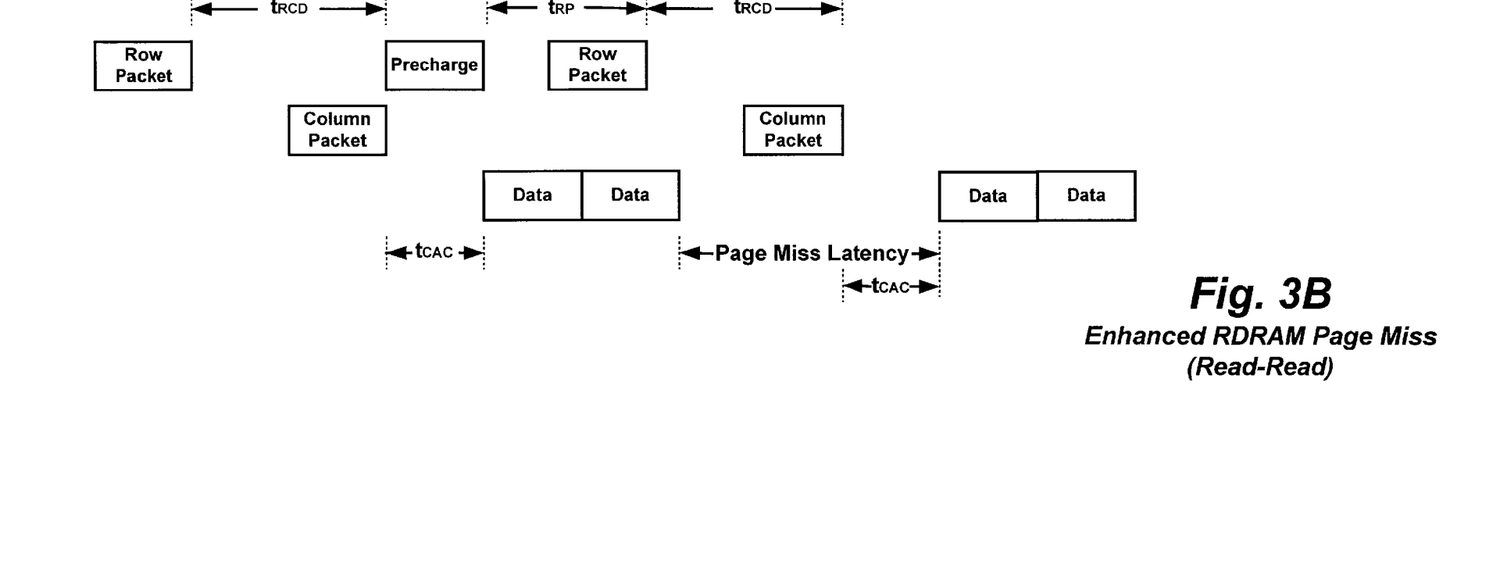
FIG. 3B is a corresponding simplified timing diagram of the row, column and data activity for a "page miss" occurring between two consecutive "read" transactions for the memory device of FIG. 2 in accordance with the present invention.

With reference additionally now to FIG. 3B, a corresponding simplified timing diagram of the row, column and data activity for a "page miss" occurring between two consecutive "read" transactions for the memory device 50 of FIG. 2 in accordance with the present invention is shown.

As shown, the memory device 50 can begin a precharge command in the packet following the column read command. This is possible since the read page is latched into the row register cache 56 at the end of one packet delay (10 ns) allowing DRAM bank 52 precharge to occur during the data burst. It should also be noted that the next random row packet can begin before the completion of the packets. In this example, one half packet delay (5 ns) of the row to column delay is eliminated from the "page miss" latency.

The following is a comparison of the "page miss" (Read-to-Read) latency between the Direct RDRAM device 10 (FIG. 1) and the memory device 50 (FIG. 2) of the present invention:

Page Miss (Read-to-Read)

$$=t_{OFFP}+t_{RP}+t_{RCD}+t_{CAC}+0.5*t_{Packet}$$

$$=10\text{ ns}+20\text{ ns}+22.5\text{ ns}+20\text{ ns}+5\text{ ns}=77.5\text{ ns}$$

for the Direct RDRAM 10;

$$=t_{RCD}-0.5\ t_{Packet}+t_{CAC}+0.5*t_{Packet}$$

$$=15\text{ ns}-5\text{ ns}+10\text{ ns}+5\text{ ns}=25\text{ ns}$$

for the memory device 50.

Page Miss Improvement $$=(77.5\text{ ns}-25\text{ ns})/25\text{ ns}=210\%$$

due to the row register cache 56 and DRAM banks 52 core speed plus the hidden precharge plus the hidden same bank activation feature. The hidden precharge and same bank activation features also reduce "page miss" latency for write cycles following a read as will be more fully described hereinafter.

Figure 4A:
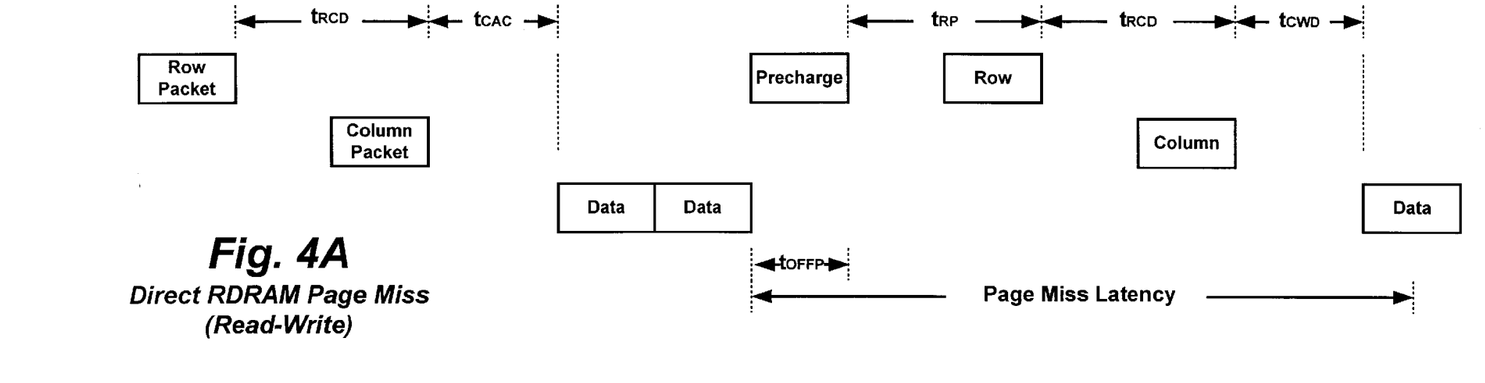
FIG. 4A is an additional simplified timing diagram of the row, column and data activity for a "page miss" occurring between consecutive "read" and "write" transactions for the conventional Direct RDRAM of FIG. 1.

With reference additionally now to FIG. 4A, an additional simplified timing diagram of the row, column and data activity for a "page miss" occurring between consecutive "read" and "write" transactions for the conventional Direct RDRAM device 10 of FIG. 1 is shown.

Since the Direct RDRAM device 10 holds data in the sense amplifiers 14 during a burst read, the precharge command does not occur until $t_{OFFP}$ after the last read data. The DRAM banks 12 memory must then precharge and another row must be accessed to the sense amplifiers 14 before data can be written.

Figure 4B:
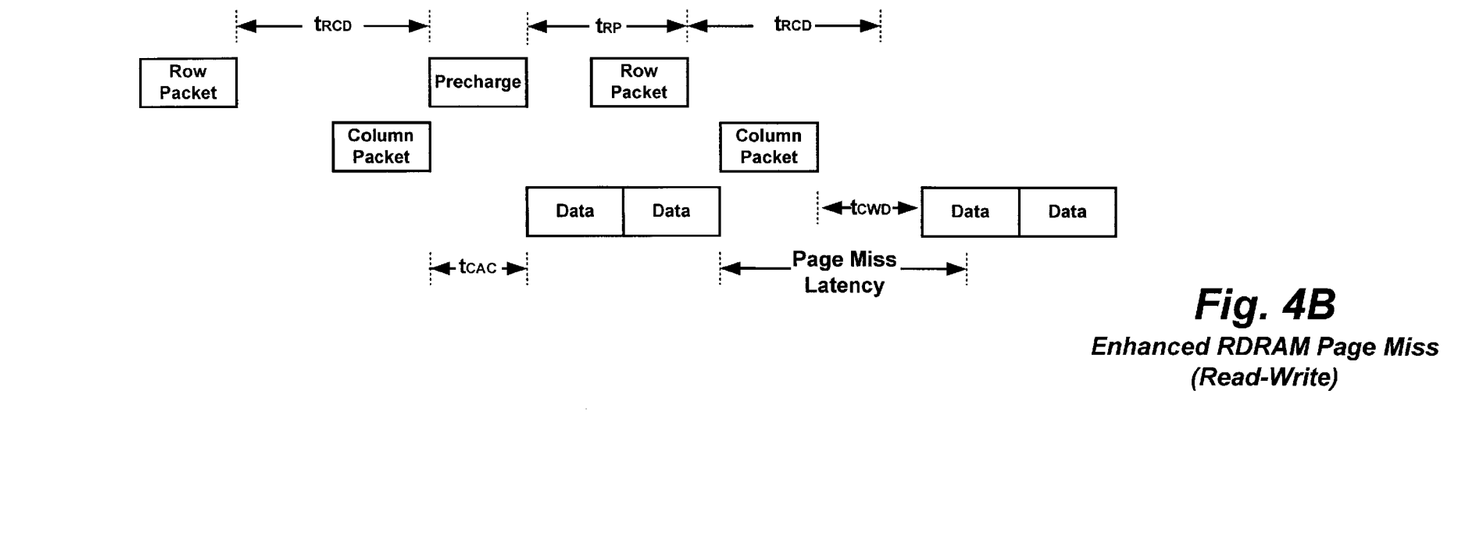
FIG. 4B is a corresponding simplified timing diagram of the row, column and data activity for a "page miss" occurring between consecutive "read" and "write" transactions for the memory device of FIG. 2.

With reference additionally now to FIG. 4B, a corresponding simplified timing diagram of the row, column and data activity for a "page miss" occurring between consecutive "read" and "write" transactions for the memory device 50 of FIG. 2 is shown.

Page Miss Latency (Read-to-Write)

$$=t_{OFFP}+t_{RP}+t_{RCD}+t_{CWD}+0.5*t_{Packet}$$

$$=10\text{ ns}+20\text{ ns}+22.5\text{ ns}+15\text{ ns}+5\text{ ns}=72.5\text{ ns}$$

for the conventional Direct RDRAM 10;

$$=t_{RCD}-0.5*t_{Packet}+t_{CWD}+0.5*t_{Packet}$$

$$=15\text{ ns}-5\text{ ns}+10\text{ ns}+5\text{ ns}=25\text{ ns}$$

for the memory device 50.

Page Miss Improvement (Read-to-Write)

$$=72.5\text{ ns}-25\text{ ns}/25\text{ ns}=190\%$$

due to the row register cache 56 and DRAM banks 52 core plus the hidden precharge and hidden same bank activation.

As can be seen, the use of the EDRAM core architecture in the memory device 50 in conjunction with the conventional Rambus Direct RDRAM architecture or other packet-based DRAM devices provides at least the following benefits:

1) Reduction in On-chip Overhead:
   Reduces internal data path from 144 bits to 72 bits; and
   Reduces the multiplexer/demultiplexer logic from 8 to 1 to 4 to 1.
2) Reduction in Initial Latency:
   Reduces initial latency of conventional Direct RDRAM;
   Reduces row access time from 57.5 ns to 40 ns (44%); and
   Reduces column access time from 35 ns to 25 ns (40%).
3) Reduction of Same Bank "page miss" Latency of Conventional Direct RDRAM:
   Reduces read to read "page miss" from 77.5 ns to 25 ns (210%);
   Reduces read to write "page miss" from 72.5 ns to 25 ns (190%);
   Reduces write to read "page miss" from 72.5 ns to 50 ns (45%); and
   Reduces write to write "page miss" from 67.5 ns to 50 ns (35%).

While there have been described above the principles of the present invention in conjunction with specific device structure it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A packet-based integrated circuit device including an address bus and internal read and write data buses, said device comprising:

at least one dynamic random access memory bank;

a row decoder associated with each of said at least one dynamic random access memory bank, said row decoder being coupled to receive a row address on said address bus;

a row register associated with each of said at least one dynamic random access memory bank, said row register for providing at least a portion of a row of data accessed from a selected row of an associated one of said at least one dynamic access memory bank to said read data bus in response to a corresponding row address provided by an associated row decoder;

a column decoder associated with each of said row register, said column decoder being coupled to receive a column address on said address bus; and a sense amplifier circuit coupled to said write data bus and associated with each of said at least one dynamic random access memory bank and coupled between said at least one dynamic access memory bank and an associated row register, said sense amplifier circuit operative to provide data to be written at a specified location in an associated one of said at least one dynamic random access memory bank in response to said row and column addresses, wherein said row register is operative to retain said at least a portion of said row of data accessed from said selected row of said associated one of said at least one dynamic random access memory bank until overwritten by updated data supplied on said write data bus corresponding to said selected row.

2. The packet-based integrated circuit device of claim 1 wherein said updated data may be written substantially concurrently to said row register and said selected row of said dynamic random access memory bank.

3. A packet-based integrated circuit device including an address bus and internal read and write data buses, said device comprising:

at least one dynamic random access memory bank;

a row decoder associated with each of said at least one dynamic random access memory bank, said row decoder being coupled to receive a row address on said address bus;

a row register associated with each of said at least one dynamic random access memory bank, said row register for providing at least a portion of a row of data accessed from a selected row of an associated one of said at least one dynamic access memory bank to said read data bus in response to a corresponding row address provided by an associated row decoder;

a column decoder associated with each of said row register, said column decoder being coupled to receive a column address on said address bus; and a sense amplifier circuit coupled to said write data bus and associated with each of said at least one dynamic random access memory bank and coupled between said at least one dynamic access memory bank and an associated row register, said sense amplifier circuit operative to provide data to be written at a specified location in an associated one of said at least one dynamic random access memory bank in response to said row and column addresses, wherein said data to be written to said device is selectively writable substantially concurrently to said row register.

4. The packet-based integrated circuit device of claim 3 wherein said data to be written to said device is selectively writable substantially concurrently to said row register if said row of data to be written to said associated one of said dynamic access random memory bank corresponds to said selected row.

5. A packet-based integrated circuit device including an address bus and internal read and write data buses, said device comprising:

at least one dynamic random access memory bank;

a row decoder associated with each of said at least one dynamic random access memory bank, said row decoder being coupled to receive a row address on said address bus;

a row register associated with each of said at least one dynamic random access memory bank, said row register for providing at least a portion of a row of data accessed from a selected row of an associated one of said at least one dynamic access memory bank to said read data bus in response to a corresponding row address provided by an associated row decoder;

a column decoder associated with each of said row register, said column decoder being coupled to receive a column address on said address bus; and a sense amplifier circuit coupled to said write data bus and associated with each of said at least one dynamic random access memory bank and coupled between said at least one dynamic access memory bank and an associated row register, said sense amplifier circuit operative to provide data to be written at a specified location in an associated one of said at least one dynamic random access memory bank in response to said row and column addresses, wherein said sense amplifier circuit is selectively decouplable from said associated row register and said at least one dynamic random access memory bank may be precharged while said sense amplifier circuit is decoupled from said associated row register.

6. The packet-based integrated circuit device of claim 5 wherein said at least a portion of said row of data retained in said row register may be provided to said read data bus while said dynamic random access memory bank is precharged.

7. A packet-based integrated circuit device including an address bus and internal read and write data buses, said device comprising:

at least one dynamic random access memory bank;

a row decoder associated with each of said at least one dynamic random access memory bank, said row decoder being coupled to receive a row address on said address bus;

a row register associated with each of said at least one dynamic random access memory bank, said row register for providing at least a portion of a row of data accessed from a selected row of an associated one of said at least one dynamic access memory bank to said read data bus in response to a corresponding row address provided by an associated row decoder;

a column decoder associated with each of said row register, said column decoder being coupled to receive a column address on said address bus; and a sense amplifier circuit coupled to said write data bus and associated with each of said at least one dynamic random access memory bank and coupled between said at least one dynamic access memory bank and an associated row register, said sense amplifier circuit operative to provide data to be written at a specified location in an associated one of said at least one dynamic random access memory bank in response to said row and column addresses, wherein said sense amplifier circuit is selectively decouplable from said associated row register and said at least one dynamic random access memory bank may be refreshed while said sense amplifier circuit is decoupled from said associated row register.

8. The packet-based integrated circuit device of claim 5 wherein said at least a portion of said row of data retained in said row register may be provided to said read data bus while said at least one dynamic access memory bank is refreshed.

* * * * *